(12) United States Patent
Kawashima

(10) Patent No.: US 10,511,220 B2
(45) Date of Patent: Dec. 17, 2019

(54) CONTROL DEVICE FOR ACTIVE FILTER

(71) Applicant: DAIKIN INDUSTRIES, LTD., Osaka-shi, Osaka (JP)

(72) Inventor: Reiji Kawashima, Osaka (JP)

(73) Assignee: DAIKIN INDUSTRIES, LTD., Osaka-Shi (JP)

( * ) Notice: Subject to any disclaimer, the term of this patent is extended or adjusted under 35 U.S.C. 154(b) by 0 days.

(21) Appl. No.: 16/335,923

(22) PCT Filed: Jun. 21, 2017

(86) PCT No.: PCT/JP2017/022884
§ 371 (c)(1),
(2) Date: Mar. 22, 2019

(87) PCT Pub. No.: WO2018/061352
PCT Pub. Date: Apr. 5, 2018

(65) Prior Publication Data
US 2019/0312503 A1    Oct. 10, 2019

(30) Foreign Application Priority Data

Sep. 30, 2016 (JP) ................... 2016-192802

(51) Int. Cl.
| | |
|---|---|
| *H03B 1/00* | (2006.01) |
| *G05B 11/42* | (2006.01) |
| *H02M 1/12* | (2006.01) |
| *H02M 1/44* | (2007.01) |
| *H03H 11/04* | (2006.01) |
| *H02J 3/01* | (2006.01) |
| *H02M 5/458* | (2006.01) |

(52) U.S. Cl.
CPC ............... *H02M 1/12* (2013.01); *H02J 3/01* (2013.01); *H02M 1/44* (2013.01); *H03H 11/04* (2013.01); *H02M 5/458* (2013.01)

(58) Field of Classification Search
None
See application file for complete search history.

(56) References Cited

U.S. PATENT DOCUMENTS

| | | | |
|---|---|---|---|
| 10,048,655 B2 * | 8/2018 | Kawashima | ............ H02M 7/48 |
| 2015/0323232 A1 * | 11/2015 | Kawashima | ............ H02J 3/01 |
| | | | 62/228.1 |

(Continued)

FOREIGN PATENT DOCUMENTS

| | | |
|---|---|---|
| JP | H09-056086 A | 2/1997 |
| JP | H10-210658 A | 8/1998 |

(Continued)

OTHER PUBLICATIONS

International Preliminary Report on Patentability and English translation of the Written Opinion of the International Searching Authority for Application No. PCT/JP2017/022884, dated Apr. 11, 2019.

(Continued)

*Primary Examiner* — Lincoln D Donovan
*Assistant Examiner* — Khareem E Almo
(74) *Attorney, Agent, or Firm* — Birch, Stewart, Kolasch & Birch, LLP

(57) ABSTRACT

Disclosed is a control device controlling an operation of an active filter which is connected in parallel with a load at an installation point (P) with respect to an AC power source and which supplies a compensation current (Ic) to the installation point (P) so as to compensate for a harmonic component of a load current (Io) flowing through the load. The control device includes: a dq converter converting the load current (Io) into a component of a d-axis current and a component of a q-axis current; a high-pass filter extracting a harmonic component from at least the component of the q-axis current output from the dq converter; a multiplier outputting a result obtained by multiplying a component of a d-axis current output from the high-pass filter by a compensation rate (Kd) as a current command value (id*); and a multiplier outputting a result obtained by multiplying the component of the q-axis current output from the dq converter or a component (Continued)

of a q-axis current output from the high-pass filter by a compensation rate (Kq) as a current command value (iq*). The compensation rate (Kq) of the q-axis current in the multipliers is adjustable.

5 Claims, 9 Drawing Sheets

(56) References Cited

U.S. PATENT DOCUMENTS

2016/0070241 A1    3/2016  Kawashima
2017/0207698 A1*   7/2017  Kuboyama ............ G01R 19/04
2017/0310235 A1*  10/2017  Sakakibara ........... H02M 1/088

FOREIGN PATENT DOCUMENTS

| | | |
|---|---|---|
| JP | 2007-282365 A | 10/2007 |
| JP | 2014-207798 A | 10/2014 |
| JP | 2016-116330 A | 6/2016 |
| WO | WO 2014/171233 A1 | 10/2014 |

OTHER PUBLICATIONS

International Search Report for PCT/JP2017/022884 (PCT/ISA/210) dated Aug. 1, 2017.

* cited by examiner

CONTROL DEVICE FOR ACTIVE FILTER

TECHNICAL FIELD

The present invention relates to a control device for an active filter, and more particularly relates to a technique for compensating for a harmonic current using an active filter.

BACKGROUND ART

Conventionally, a load current supplied from an AC power source and flowing into a load such as an AC/AC converter includes a component of a harmonic current. In order to solve this problem caused by the harmonic current, an active filter in parallel with the load is provided, so that harmonic components of the load current do not flow out to the AC power source (see, for example, Patent Document 1).

A conventionally known technique reduces the capacity of an active filter to the minimum necessary level (see Patent Document 2). In order to do so, Patent Document 2 shows detecting a generation amount of harmonic components of different orders from a harmonic current generated in a load connected through a system bus to a system power source. It further discloses, with an order harmonic component that is most likely to occur among components of respective harmonic orders as a reference, setting a predetermined mutual ratio for each order harmonic component based on the harmonic component of the referential order. It further discloses performing calculation processing using the generation amount of each order harmonic component and the mutual ratio for each order harmonic component, such that the compensation amount output from the active filter is controlled to be equal to a target amount obtained through subtraction of an upper limit of a harmonic component (standard value) regulated by a harmonic guideline from the generation amount of each order harmonic component.

On the other hand, if an electrolytic capacitorless inverter is employed as a load, the compensation current control of the active filter becomes oscillatory at the resonance frequency of the electrolytic capacitorless inverter, as the power source impedance increases. Therefore, the active filter has to be controlled in order to reduce the resonance. For example, a control device for an active filter subtracts a differential value with an amplification at a certain gain with respect to an installation point voltage of the active filter from a value obtained based on a compensation current and a load current. As a result, the device obtains a voltage command value which is a command value of a voltage to be output from the active filter (see Patent Document 3).

CITATION LIST

Patent Document

[Patent Document 1] Japanese Unexamined Patent Publication No. 2014-207798
[Patent Document 2] Japanese Unexamined Patent Publication No. H10-210658
[Patent Document 3] Japanese Unexamined Patent Publication No. 2016-116330

SUMMARY OF THE INVENTION

Technical Problem

The technique of Patent Document 2 cannot effectively reduce resonance when an electrolytic capacitorless inverter is employed as a load and a power source impedance is large.

In addition, the technique of Patent Document 3 cannot reduce the capacity of an active filter.

It is an object of the present invention to provide a control device for an active filter, the device capable of reducing the capacity of the active filter and reducing resonance when a power source impedance is large while reducing a harmonic current to a value equal to or lower than a standard value.

Solution to the Problem

In order to achieve the above object, a first aspect of the present invention is directed to a control device for an active filter, the control device (71, 72, 73) controlling an operation of the active filter (6) which is connected in parallel with a load (2) at an installation point (P) with respect to an AC power source (1) and which supplies a compensation current (Ic) to the installation point (P) so as to compensate for a harmonic component of a load current (Io) flowing through the load (2), the control device (71, 72, 73) including: a dq converter (703) converting the load current (Io) into a component of a d-axis current and a component of a q-axis current; a high-pass filter (704, 705) extracting a harmonic component from at least the component of the d-axis current and the component of the q-axis current, which are output from the dq converter (703); a multiplier (716) outputting a result obtained by multiplying a component of a d-axis current output from the high-pass filter (704) by a compensation rate (Kd) as a current command value (id*); a multiplier (717) outputting a result obtained by multiplying the component of the q-axis current output from the dq converter (703) or a component of a q-axis current output from the high-pass filter (705) by a compensation rate (Kq) as a current command value (iq*); a calculator (712, 713, 714, 715) calculating a voltage command value (Vid, Viq) that is a command value of a voltage (Vr) to be output from the active filter (6) based on an output of each of the multipliers (716, 717) and a result of detecting the compensation current (Ic); and a driving signal generator circuit (720) generating a signal (G) driving and controlling the active filter (6) based on the voltage command value (Vid, Viq), wherein the compensation rate (Kq) of the q-axis current in the multipliers (716, 717) is adjustable.

In this configuration, when the active filter (6) not only reduces the harmonic component but also improves the fundamental power factor, a result of multiplying the q-axis current component output from the dq converter (703) by a compensation rate (Kq) is output as the current command value (iq*) to compensate for a fundamental component of the q-axis current and a harmonic component of the q-axis current, without providing a high-pass filter (705) extracting a harmonic component from the component of the q-axis current output from the dq converter (703).

Further, in this configuration, among the d-axis harmonic current and the q-axis harmonic current, which are output from the dq converter (703) and the high-pass filter (704, 705), the compensation rate (Kq), which is particularly multiplied by the q-axis harmonic current, is adjusted to a value smaller than 1.0. In view of the fact that a q-axis current component is dominant in the harmonic current of an electrolytic capacitorless inverter, a compensation rate (Kq) of a q-axis current is mainly adjusted to reduce resonance in a case where the power source impedance is large while reducing a harmonic current to a value equal to or lower than a standard value. Conversely, even if the compensation rate (Kd) of the d-axis current is reduced, the increase of the harmonic current flowing into the AC power source (1) is small. Therefore, by setting the compensation rate (Kd) of the d-axis current as small as possible, the capacity of the active filter (6) is reduced as much as possible.

A second aspect of the invention is an embodiment of the first aspect. In the second aspect, the compensation rate (Kq) of the q-axis current in the multipliers (716, 717) is adjusted according to a magnitude of the load current (Io).

In this configuration, for example, when the load is low, i.e., when the load current (Io) is small, the compensation rate (Kq) of the q-axis current is adjusted to be small.

A third aspect of the invention is an embodiment of the first or second aspect. In the third aspect, the compensation rate (Kq) of the q-axis current in the multipliers (716, 717) is adjusted according to a case temperature (tc) of a device constituting the active filter (6).

In this configuration, for example, when the case temperature (tc) becomes equal to or higher than a predetermined temperature, the compensation rate (Kq) of the q-axis current is adjusted to be extremely small.

A fourth aspect of the invention is an embodiment of any one of the first to third aspect. In the fourth aspect, the compensation rate (Kd) of the d-axis current in the multipliers (716, 717) is further adjustable.

In this configuration, both the compensation rate (Kq) of the q-axis current and the compensation rate (Kd) of the d-axis current can be adjusted.

Advantages of the Invention

According to the first aspect of the present invention, it is possible to reduce the capacity of the active filter (6) and reduce resonance when the power source impedance is large while reducing the harmonic current to a value equal to or lower than the standard value.

According to the second aspect of the present invention, by optimally adjusting the compensation rate (Kq) of the q-axis current according to the magnitude of the load current (Io), it is possible to adapt the load to the harmonic regulation while reducing the loss of the active filter (6) at the time of the light load.

According to the third aspect of the present invention, it is possible to prevent thermal breakdown of the device by reducing the compensation rate (Kq) of the q-axis current on condition that the case temperature (tc) of the device becomes equal to or higher than a predetermined temperature.

According to the fourth aspect of the present invention, since both of the compensation rate (Kq) of the q-axis current and the compensation rate (Kd) of the d-axis current can be adjusted, the degree of freedom in control can be increased.

BRIEF DESCRIPTION OF THE DRAWINGS

FIG. 2 shows an example in which the power source impedance is small. In the example of FIG. 2, while the compensation rate of the d-axis current and the compensation rate of the q-axis current are equal to each other, the compensation rates are changed in order to compensate for the harmonic current included in a load current.

DESCRIPTION OF EMBODIMENTS

Embodiments of the present invention will be described in detail below with reference to the drawings. The embodiment described below is merely an exemplary one in nature, and is not intended to limit the scope, applications, or use of the invention.

First Embodiment

Figure 1:
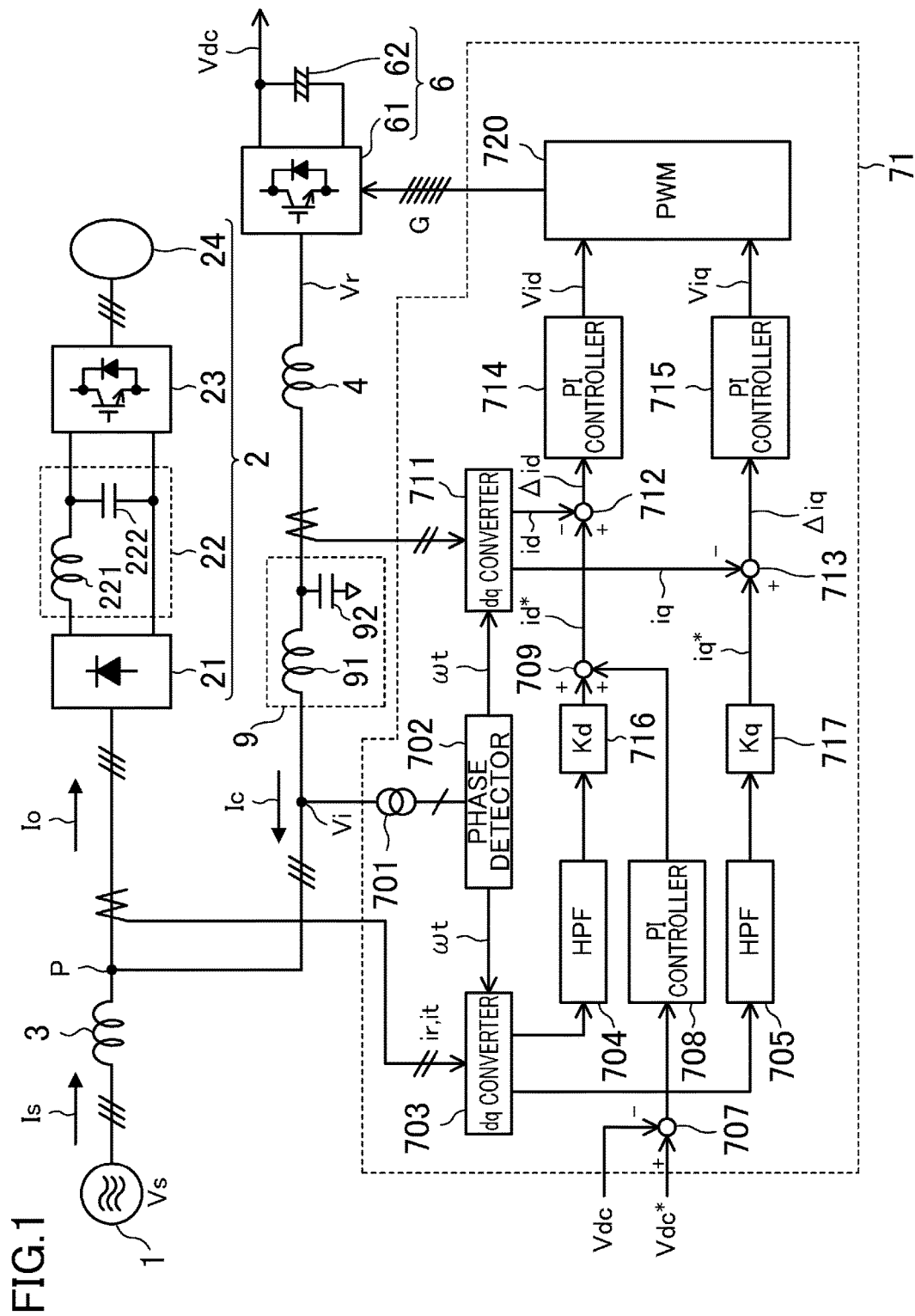
FIG. 1 is a block diagram showing the configuration of a control device for an active filter of a first embodiment, together with the configuration of a control target and the configuration of the vicinity of the control device.

FIG. 1 is a block diagram showing the configuration of a control device (71) for an active filter of a first embodiment, together with the configuration of an active filter (6) to be controlled and the configuration of the vicinity of the control device (71).

<Entire Configuration>

A three-phase alternating current (AC) power source (1) outputs a power source current (Is). The active filter (6) is connected in parallel with a load (2) via a three-phase system interconnection reactor (4) with respect to the AC power source (1). The active filter (6) applies a three-phase voltage (Vr) to the system interconnection reactor (4) to output a three-phase compensation current (Ic) to the system interconnection reactor (4).

Here, the direction of the compensation current (Ic) from the active filter (6) toward the AC power source (I) is positive. Therefore, it is assumed that the sum of the three-phase power source current (Is) flowing from the AC power source (1) and the compensation current (Ic) is a three-phase load current (Io) input to the load (2).

The power source impedance of the AC power source (1) is shown as a reactor (3). The power source current (Is) flows in the reactor (3) to generate a three-phase voltage in the reactor (3). If a three-phase voltage (Vs) output from the AC power source (1) is introduced in a situation where the reactor (3) is negligible, a three phase voltage (Vi) of a side of the reactor (3) adjacent to the load (2) is a voltage obtained through subtraction of a voltage between both terminals of the reactor (3) from the voltage (Vs). That is to say, the AC power source (1) substantially outputs the voltage (Vi), not the voltage (Vs).

Note that the side of the reactor (3) adjacent to load (2) is shown as an installation point (P) because the load (2) and the active filter (6) are connected together via the system interconnection reactor (4). Thus, the voltage (Vi) may be hereinafter referred to as an installation point voltage (Vi). On the other hand, the voltage (Vs) may be hereinafter referred to as a power source voltage (Vs).

In FIG. 1, since three phases of the AC power source (1), the reactor (3), and the system interconnection reactor (4) are collectively represented as one phase, the installation point P is also shown as one point. However, actually, there is one installation point in each phase, and three installation points exist in total.

<Configuration of Active Filter>

The active filter (6) includes, for example, an inverter (61) and a capacitor (62). The inverter (61) inputs and outputs the compensation current (Ic), whereby the d-axis current charges and discharges the capacitor (62) to a DC voltage (Vdc), and the q-axis current circulates between lines inside the inverter (61) without passing through the capacitor (62).

For example, the inverter (61) is a voltage type source inverter, wherein three current paths are connected together in parallel with respect to the capacitor (62), and two switching elements are provided in each current path.

<Configuration of Control Device for Active Filter>

The control device (71) includes an AC voltage detector (701), a phase detector (702), dq converters (703, 711), high-pass filters (704, 705), multipliers (716, 717), subtractors (707, 712, 713), proportional-integral controllers (708, 714, 715), an adder (709), and a drive signal generator circuit (720).

The AC voltage detector (701) detects the three-phase installation point voltage (Vi), more particularly, an inter-phase voltage between them, and provides it to the phase detector (702). The phase detector (702) detects a phase (ωt) of the installation point voltage (Vi) and transmits it to the dq converter (703, 711). The AC voltage detector (701) may be configured to detect a zero cross point of the installation point voltage (Vi) using a photocoupler.

The dq converter (703) converts the detected load current (Io) from three-phase to two-phase. The d-axis and the q-axis are rotating coordinate systems rotating synchronously with the phase detected by the phase detector (702).

At this time, since the load current (Io) is a three-phase current, the d-axis component and the q-axis component of the load current (Io) can be obtained if load currents (ir, it) that are two phases of the load current (Io) are detected. FIG. 1 shows an example in which the load currents (ir, it) of two phases are detected as described above.

The dq converter (711) converts the detected compensation current (Ic) from three-phase to two-phase, and obtains a d-axis current (id) and a q-axis current (iq). At this time, since the compensation current (Ic) is also a three-phase current, the d-axis current (id) and the q-axis current (iq) can be obtained if two phases of the compensation current (Ic) are detected. FIG. 1 shows an example in which currents of two phases are detected as described above.

The high-pass filters (704, 705) respectively eliminate a DC component of the d-axis component and a DC component of the q-axis component of the load current (Io).

Of the load current (Io), a component synchronized with the phase (ωt) appears as a DC component in both of the d-axis component and the q-axis component. In other words, if there is no harmonic component in the load current (Io), the d-axis component and the q-axis component become DC. Thus, the high-pass filter (704, 705) outputs only the harmonic component of the d-axis and q-axis components of the load current (Io).

The multipliers (716, 717) respectively multiply the output of the high-pass filter (704, 705) by adjustable compensation rates (Kd, Kq), and outputs a result of the multiplication.

In addition, when the active filter (6) not only reduces the harmonic component but also improves the fundamental power factor, the high-pass filter (705) for extracting the harmonic component from the q-axis current component output from the dq converter (703) is not provided. Instead, a fundamental component and a harmonic component included in the q axis current component output from the dq converter (703) may be input to the multiplier (717).

If the d-axis and q-axis currents (id, iq) of the compensation current (Ic) coincide with the harmonic component of the load current (Io) without phase deviation, they compensate for the harmonic component of the load current (Io), and a harmonic component is not generated in the power source current (Is). Therefore, if the correction in the d-axis, which will be described later, is not considered, the multiplier (716, 717) can output a command value of the d-axis current (id) of the compensation current (Ic) and a command value of the q-axis current (Iq) of the compensation current (Ic).

A command value (iq*) of the q-axis current (iq) can be obtained by the multiplier (717) on the q-axis side. On the other hand, the command value (id*) of the d-axis current (id) is corrected to correspond to the fluctuation of the DC voltage (Vdc) with respect to the output of the multiplier (716) on the d-axis side. More specifically, it is modified as follows.

The subtractor (707) obtains a deviation between the DC voltage (Vdc) supported by the capacitor (62) and a command value (Vdc*) of the DC voltage (Vdc). The proportional-integral controller (708) performs proportional-integral control on the deviation obtained from the subtractor (707) to obtain a correction value. The correction value and an output of a multiplier (716) on the d-axis side are added up by the adder (709). Thus, the command value (id*), which is small in the influence of fluctuation in the DC voltage (Vdc), is obtained from the adder (709).

The subtractors (712, 713) respectively output deviations (Δid, Δiq). The deviation (Δid) of the d-axis current is obtained through subtraction of the d-axis current (id) from the command value (id*). The deviation (Δiq) of the q-axis current is obtained through subtraction of the q-axis current (iq) from the command value (iq*).

The proportional-integral controllers (714, 715) on the d-axis side and the q-axis side respectively perform proportional-integral control on the deviations (Δid, Δiq), and respectively output values that are results of the proportional calculation as voltage command values (Vid, Viq).

Here, since the installation point voltage (Vi) supplied from the AC power source (1) is a three-phase voltage, the current command values (id*, iq*) are synchronized with the installation point voltage (Vi) with a period which is ⅙ times the period of the installation point voltage (Vi) in a steady state.

The drive signal generator circuit (720) generates a drive signal (G) for driving and controlling the active filter (6) based on the voltage command values (Vid, Viq). Since the configuration of the drive signal generator circuit (720) having such a function is well known, a description thereof will be omitted here.

<Configuration of Load>

In an example in this embodiment, the load (2) is an air conditioner including an inverter (23) and a compressor (24) controlled by the inverter (23) and compressing a refrigerant (not shown). The load (2) further includes a converter (21) and a low-pass filter (22) to supply a DC power source to the inverter (23). The low-pass filter (22) is provided between the converter (21) and the inverter (23).

The low-pass filter (22) is implemented as a choke-input filter including a reactor (221) and a capacitor (222). Specifically, the capacitor (222) is a film capacitor with a smaller capacitance than an electrolytic capacitor, and is connected in parallel with the inverter (23) in a DC link between the converter (21) and the inverter (23). In addition, the reactor (221) is connected in series to one DC bus of the DC link on a position closer to the converter (21) than the capacitor (222).

<Other Configurations>

In order to eliminate the ripple of the compensation current (Ic), as shown in FIG. 1, the low-pass filter (9) including the reactor (91) and the capacitor (92) is preferably provided between the system interconnection reactor (4) and the AC voltage detector (701), for example. In this case, only one phase of the low-pass filter (9) is shown, but in actuality, three phases are provided.

<Operation of Control Device for Active Filter>

The active filter (6) is connected in parallel with the load (2) at the installation point (P) with respect to the AC power source (I), and supplies the compensation current (Ic) to the installation point (P) so as to compensate for the harmonic component of the load current (Io) flowing through the load (2). If compensation is completely performed, then the power source current (Is) will have a sinusoidal current waveform that does not contain harmonic components. The control device (71) controls the operation of the active filter (6).

In the control device (71) of FIG. 1, the d-axis and q-axis current command values (id*, iq*) are set respectively using the compensation rates of the d-axis and q-axis currents as Kd and Kq.

Figure 2:
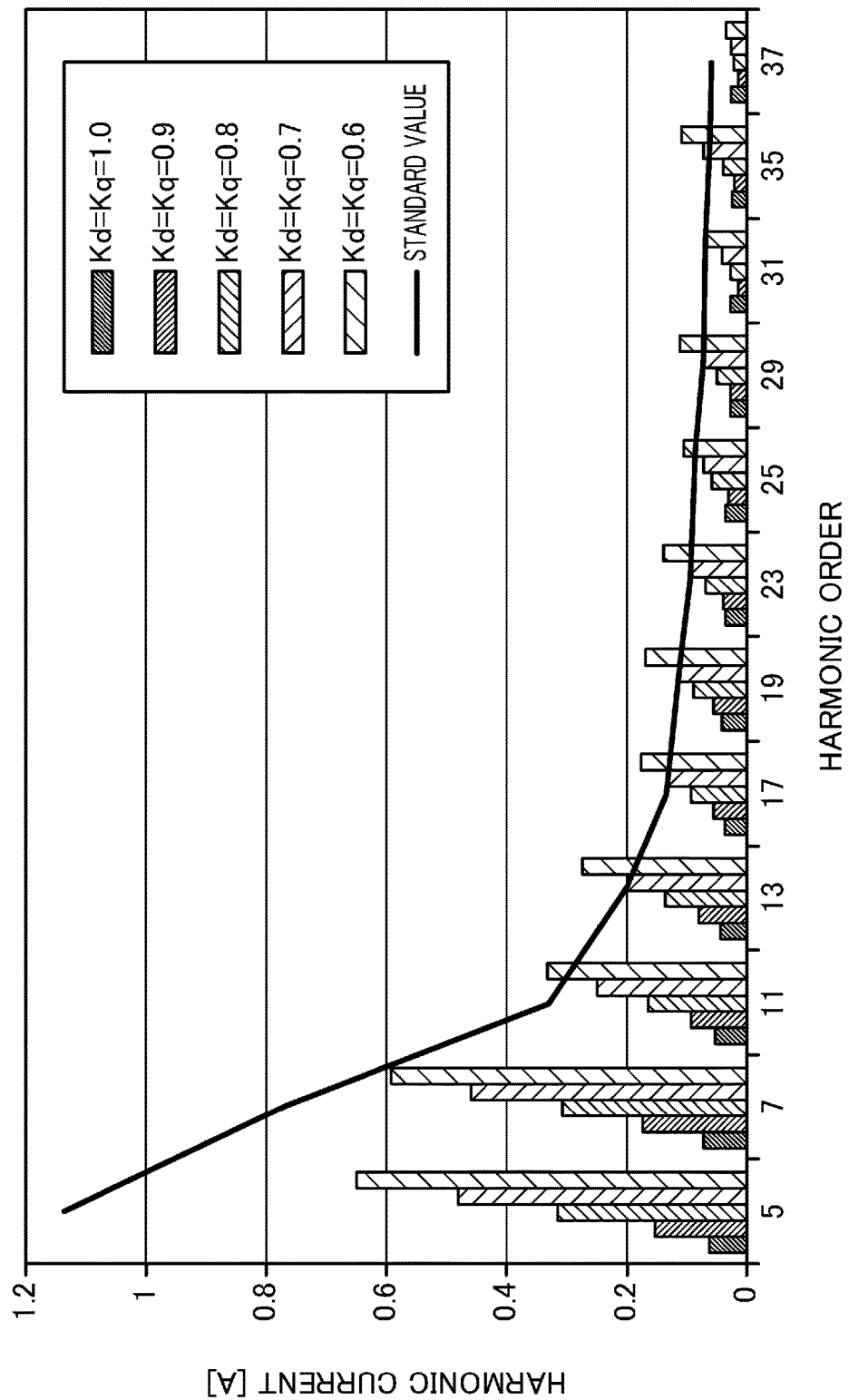
FIG. 2 is a diagram showing how a harmonic current included in a power source current changes.

FIG. 2 is a diagram showing how a harmonic current included in a power source current (Is) changes. FIG. 2 shows an example in which the reactor (3) is equivalent to 50 μH per phase and the power source impedance is small. In the example of FIG. 2, while the compensation rate (Kd) of the d-axis current and the compensation rate (Kq) of the q-axis current are equal to each other, the compensation rates (Kd, Kq) are changed from 1.0 to 0.6 in order to compensate for the harmonic current included in the load current (Io).

FIG. 2 shows that there is a harmonic order which cannot satisfy the exemplified harmonic regulation standard value (according to the standard IEC 61000-3-2 Class A) when Kd=Kq=0.7 to 0.6, but that the standard value is satisfied in all harmonic orders when Kd=Kq=1.0 to 0.8. For example, when the compensation rates (Kd, Kq) of the d-axis and q-axis currents are both 0.8, the device capacity of the active filter (6) can be reduced by 20%.

Figure 3:
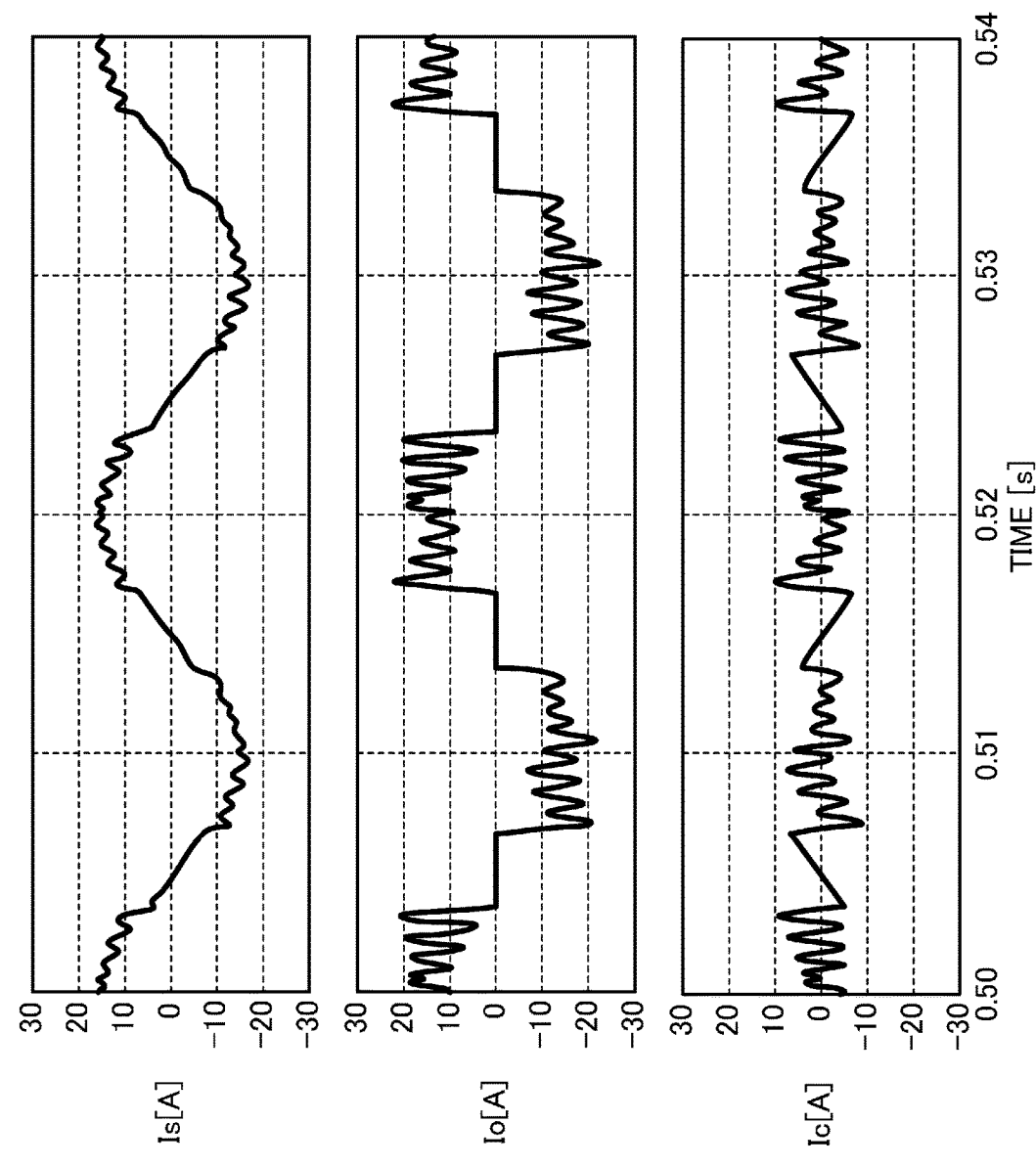
FIG. 3 is a current waveform diagram of each portion in FIG. 1 when the compensation rate of the d-axis current and the compensation rate of the q-axis current are both 0.8 in a situation where the power source impedance is large.

FIG. 3 is a current waveform diagram of each portion in FIG. 1 when the compensation rates (Kd, Kq) of the d-axis and q-axis currents are both 0.8 in a situation where the reactor (3) is equivalent to 1 MH per phase and the power source impedance is large. According to FIG. 3, a pulsation caused by resonance occurs in the power source current (Is). As described above, it is found that, as the power source impedance increases, resonance cannot be reduced in some cases.

Figure 4:
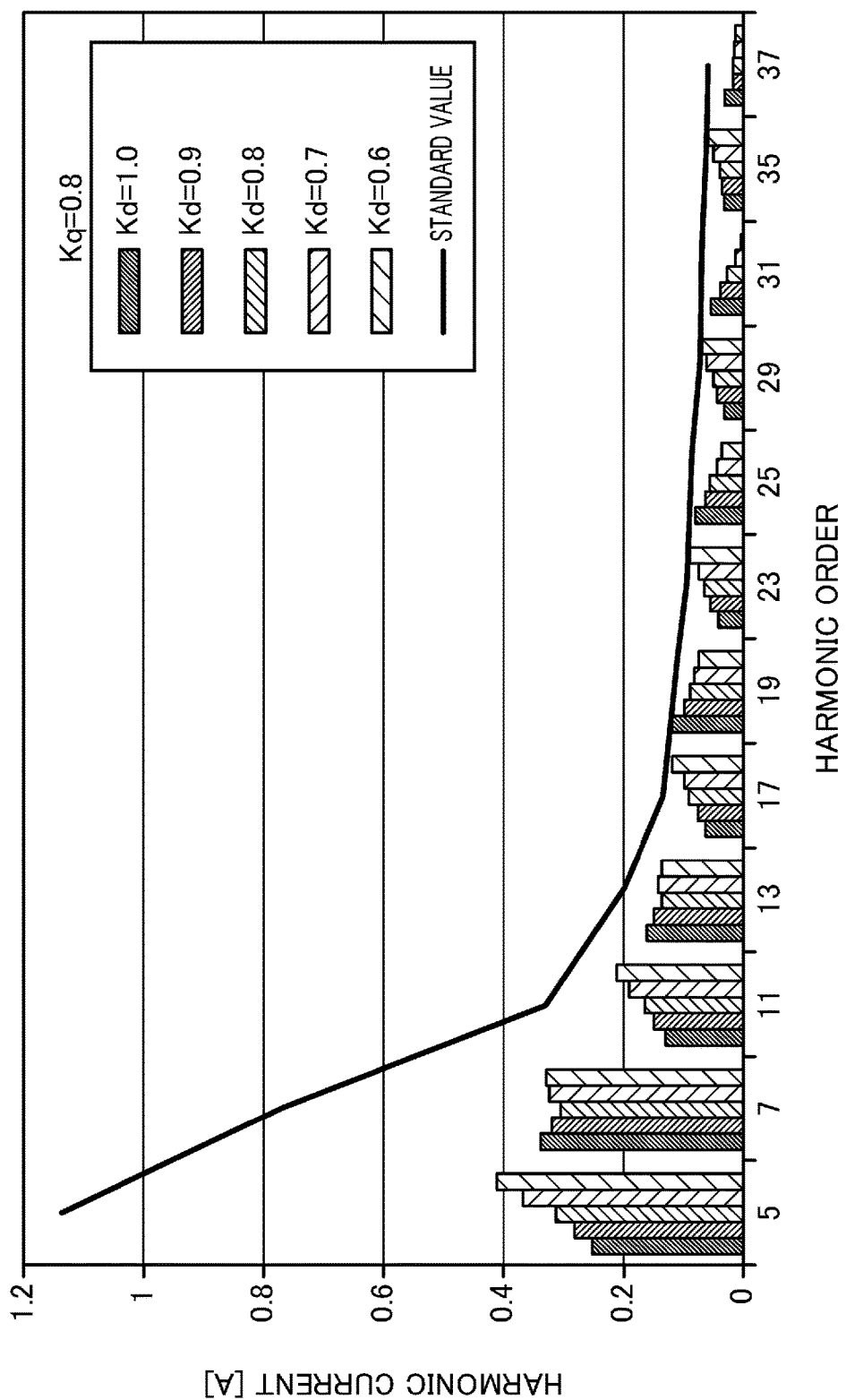
FIG. 4 is a diagram showing how a harmonic current included in the power source current changes when the compensation rate of the d-axis current is changed and the compensation rate of the q-axis current is adjusted to 0.8 in a situation where the power source impedance is small.

FIG. 4 is a diagram showing how the harmonic current included in the power source current (Is) changes. FIG. 4 shows an example in which the reactor (3) is equivalent to 50 μH per phase and the power source impedance is small. In the example of FIG. 4, the compensation rate (Kd) of the d-axis current is changed from 1.0 to 0.6 while the compensation rate (Kq) of the q-axis current is adjusted to 0.8.

FIG. 4 shows that, as long as Kq=0.8, all harmonics of Kd=1.0 to 0.6 satisfy the standard value in all harmonic orders.

Figure 5:
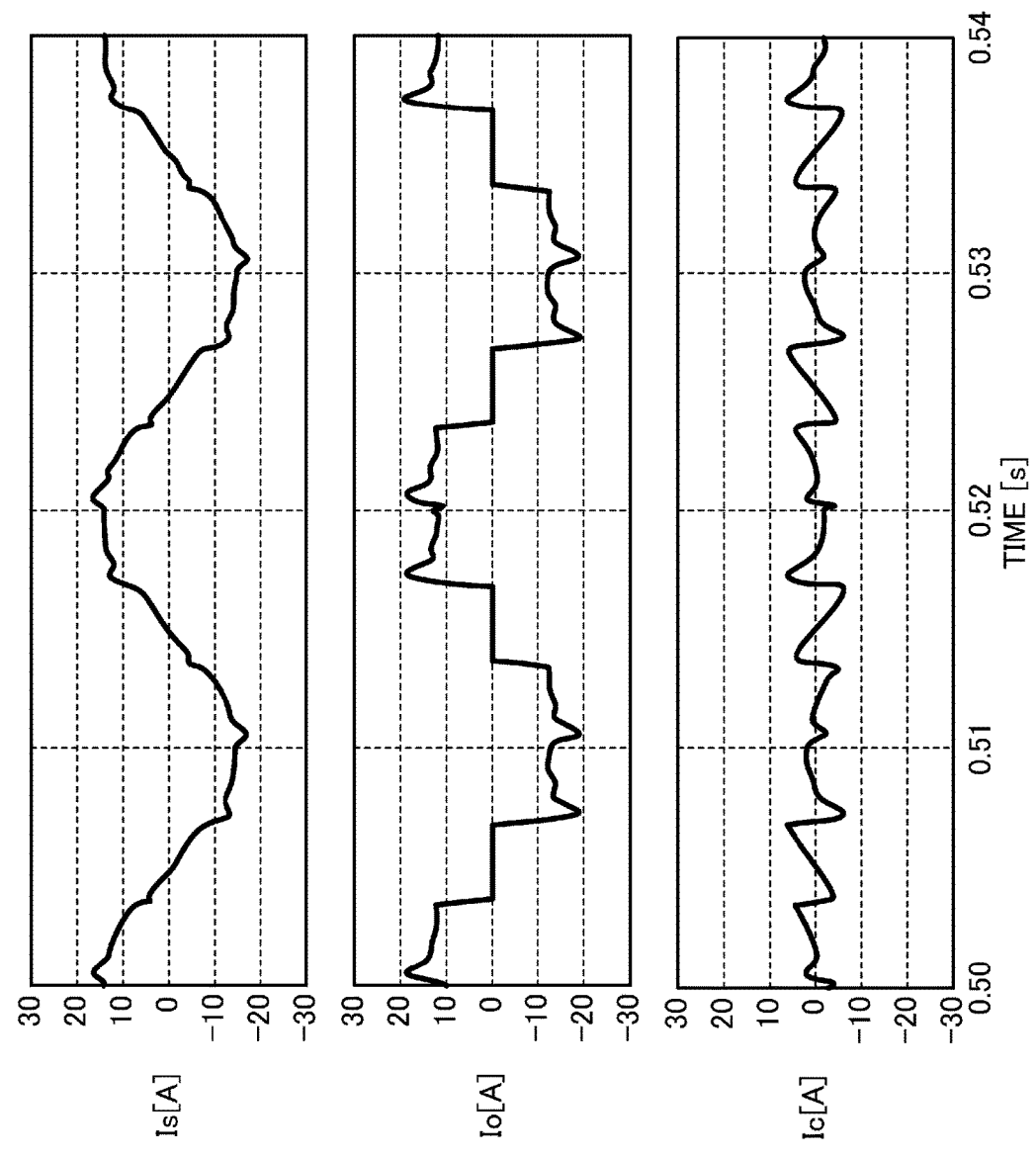
FIG. 5 is a current waveform diagram of each portion in FIG. 1 when the compensation rate of the q-axis current is set to 0.8 and the compensation rate of the d-axis current is set to 0.6 in a situation where the power source impedance is large.

FIG. 5 is a current waveform diagram of each portion in FIG. 1. In the example of FIG. 5, the reactor (3) is equivalent to 1 per phase and the power source impedance is large. In the example of FIG. 5, the compensation rate (Kq) of the q-axis current is set to 0.8 and the compensation rate (Kd) of the d-axis current is set to 0.6. FIG. 5 shows that resonance in the power source current (Is) can be reduced. Moreover, since the compensation rate (Kq) of the q-axis current and the compensation rate (Kd) of the d-axis current are both reduced to be lower than 1.0, the device capacity of the active filter (6) is reduced.

Advantages of Embodiment

This embodiment allows for reducing the capacitance of the active filter (6) and reducing resonance when the power source impedance is large, while reducing a harmonic current to a value equal to or lower than a standard value.

Second Embodiment

Figure 6:
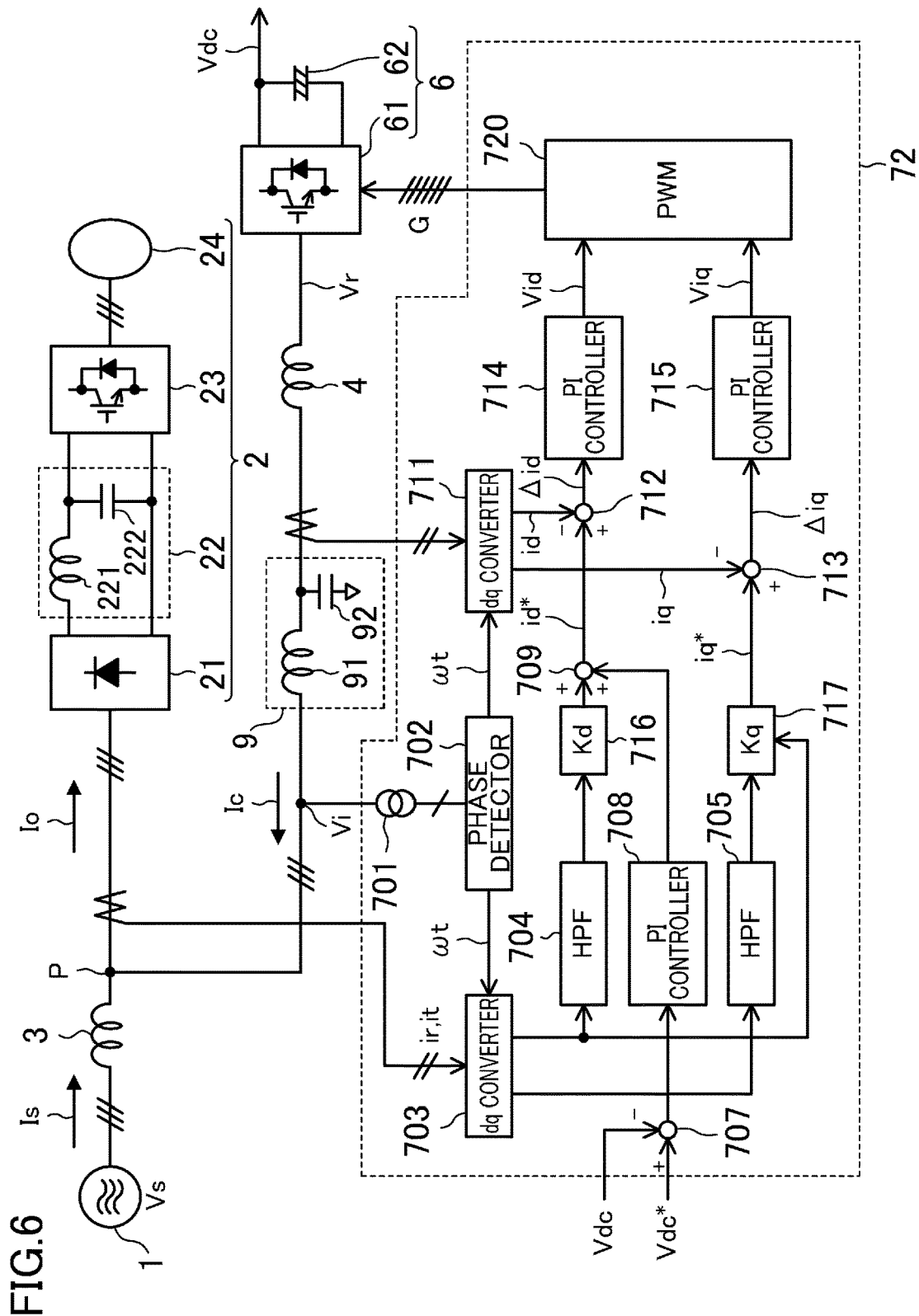
FIG. 6 is a block diagram showing the configuration of a control device for an active filter of a second embodiment, together with the configuration of a control target and the configuration of the vicinity of the control device.

FIG. 6 is a block diagram showing the configuration of a control device (72) for an active filter of a second embodiment, together with the configuration of an active filter (6) to be controlled and the configuration of the vicinity of the control device (72).

<Configuration of Control Device for Active Filter>

In the control device (72) of FIG. 6, the compensation rate (Kq) of a q-axis current in a multiplier (717) is adjusted in accordance with an output of a dq converter (703) which represents the magnitude of a load current (Io). Other elements are the same as those of the control device (71) of FIG. 1.

<Operation of Control Device for Active Filter>

Figure 7:
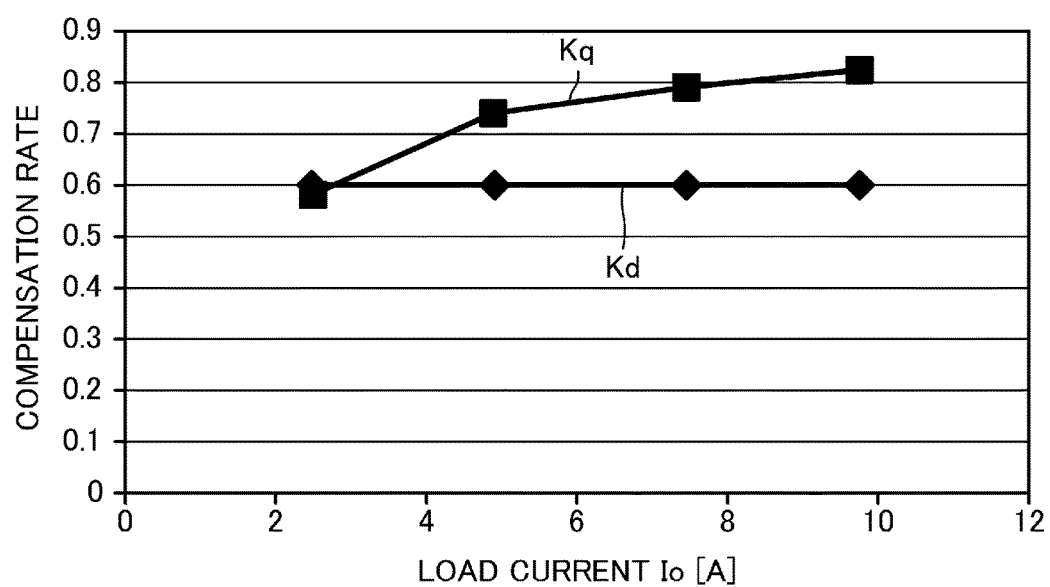
FIG. 7 is a diagram showing that the compensation rate of the q-axis current is adjusted according to the magnitude of the load current in the second embodiment.

FIG. 7 is a diagram showing that the compensation rate (Kq) of the q-axis current is adjusted according to the magnitude of the load current (Jo) in the second embodiment. According to FIG. 7, when the load is low, i.e., when the load current (Io) is small, the compensation rate (Kq) of the q-axis current is adjusted so as to be small. For example, when the magnitude of the load current (Io) is 2.5 A, the compensation rate (Kq) of the q-axis current is reduced to 0.6. On the other hand, the compensation rate (Kd) of the d-axis current is adjusted to a substantially constant value 0.6 regardless of the magnitude of the load current (Jo).

Figure 8:
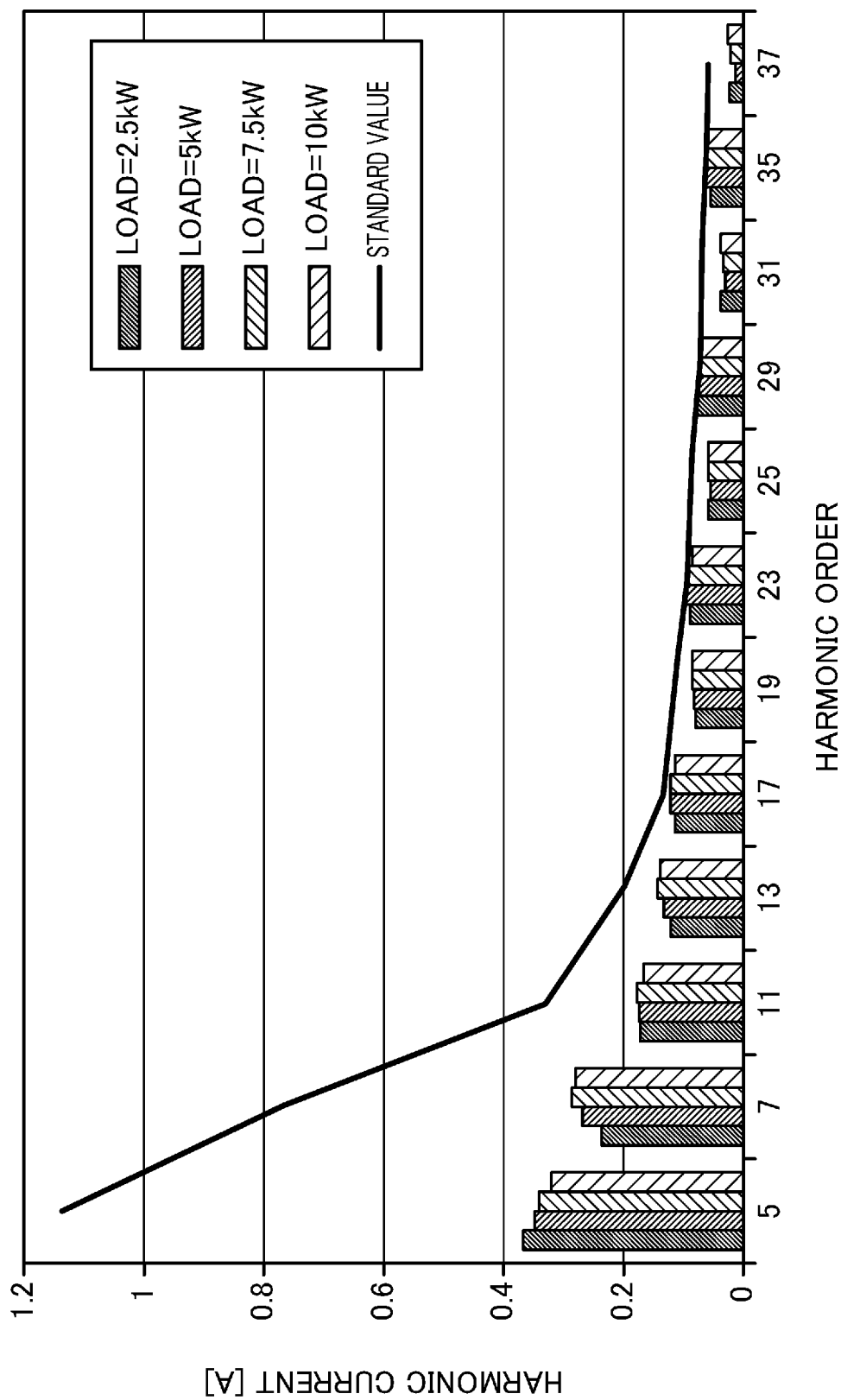
FIG. 8 is a diagram showing how the harmonic current included in the power source current changes when the magnitude of the load is changed under the compensation rate adjustment according to FIG. 7.

FIG. 8 is a diagram showing how the harmonic current included in the power source current (Is) changes when the magnitude of the load is changed under the compensation rate adjustment according to FIG. 7. FIG. 8 shows that, at any load from 2.5 kW to 10 kW, a standard value is satisfied in all harmonic orders.

Advantages of Embodiment

According to this embodiment, by optimally adjusting the compensation rate (Kq) of the q-axis current according to the magnitude of the load current (Io), it is possible to adapt the load to the harmonic regulation while reducing the loss of the active filter (6) by not performing an extra compensation at the time of the light load.

Third Embodiment

Figure 9:
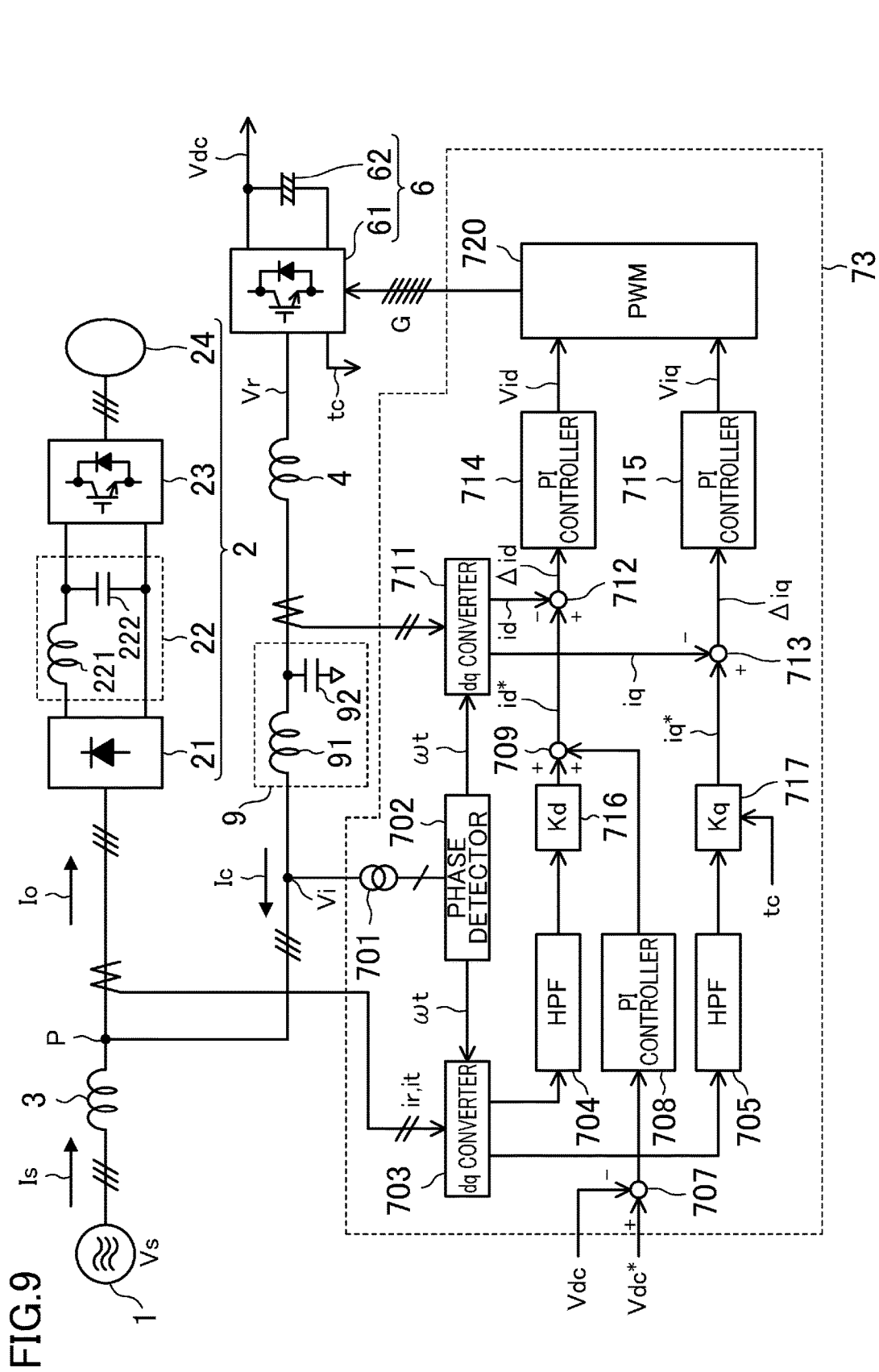
FIG. 9 is a block diagram showing the configuration of a control device for an active filter of a third embodiment, together with the configuration of a control target and the configuration of the vicinity of the control device.

FIG. 9 is a block diagram showing the configuration of a control device (73) for an active filter of a third embodiment, together with the configuration of an active filter (6) to be controlled and the configuration of the vicinity of the active filter (6).

<Configuration of Control Device for Active Filter>

In the control device (73) of FIG. 9, the compensation rate (Kq) of a q-axis current in a multiplier (717) is adjusted in accordance with the case temperature (tc) of a device constituting the active filter (6). Other elements are the same as those of the control device (71) of FIG. 1.

<Operation of Control Device for Active Filter>

In the third embodiment, when the case temperature (tc) becomes equal to or higher than a predetermined temperature, the compensation rate (Kq) of the q-axis current is adjusted so as to be extremely small.

Advantages of Embodiment

This embodiment allows for preventing thermal destruction of the device by reducing the compensation rate (Kq) of the q-axis current on condition that the case temperature (tc) of the device becomes equal to or higher than a predetermined temperature.

OTHER EMBODIMENTS

In the first to third embodiments, both the compensation rate (Kd) of the d-axis current and the compensation rate (Kq) of the q-axis current are adjustable. It is also possible to adjust only the compensation rate (Kq) of the q-axis current while the compensation rate (Kd) of the d-axis current is fixed so as to satisfy, for example, Kd=0.6.

INDUSTRIAL APPLICABILITY

The present invention is useful as a control device for an active filter capable of reducing the capacity of an active filter and reducing resonance when a power source impedance is large while reducing a harmonic current to a value equal to or lower than a standard value.

DESCRIPTION OF REFERENCE CHARACTERS

1 AC Power Source
2 Load
4 System Interconnection Reactor
6 Active Filter
71, 72, 73 Control Device for Active Filter
704, 705 High-pass Filter
712, 713 Subtractor (Calculator)
714, 715 Proportional-integral Controller (Calculator)
716, 717 Multiplier
720 Drive Signal Generator Circuit
P Installation Point

The invention claimed is:

1. A control device for an active filter, the control device controlling an operation of the active filter which is connected in parallel with a load at an installation point (P) with respect to an AC power source and which supplies a compensation current (Ic) to the installation point (P) so as to compensate for a harmonic component of a load current (Io) flowing through the load, the control device comprising:
   a dq converter converting the load current (Io) into a component of a d-axis current and a component of a q-axis current;
   a high-pass filter extracting a harmonic component from at least the component of the d-axis current of the component of the d-axis current and the component of the q-axis current, which are output from the dq converter;
   a multiplier outputting a result obtained by multiplying a component of a d-axis current output from the high-pass filter by a compensation rate (Kd) as a current command value (id*);
   a multiplier outputting a result obtained by multiplying the component of the q-axis current output from the dq converter or a component of a q-axis current output from the high-pass filter by a compensation rate (Kq) as a current command value (iq*);
   a calculator calculating a voltage command value (Vid, Viq) that is a command value of a voltage (Vr) to be output from the active filter based on an output of each of the multipliers and a result of detecting the compensation current (Ic); and
   a driving signal generator circuit generating a signal (G) driving and controlling the active filter based on the voltage command value (Vid, Viq), wherein
   the compensation rate (Kq) of the q-axis current in the multipliers is adjustable in a range larger than the compensation rate (Kd) of the d-axis current (A*).

2. The control device of claim 1, wherein
the compensation rate (Kq) of the q-axis current in the multipliers is adjusted according to a magnitude of the load current (Io).

3. The control device of claim 1, wherein
the compensation rate (Kq) of the q-axis current in the multipliers is adjusted according to a case temperature (tc) of a device constituting the active filter.

4. A control device for an active filter, the control device controlling an operation of the active filter which is connected in parallel with a load at an installation point (P) with respect to an AC power source and which supplies a compensation current (Ic) to the installation point (P) so as to compensate for a harmonic component of a load current (Io) flowing through the load, the control device comprising:
   a dq converter converting the load current (Io) into a component of a d-axis current and a component of a q-axis current;
   a high-pass filter extracting a harmonic component from at least the component of the d-axis current of the component of the d-axis current and the component of the q-axis current, which are output from the dq converter;
   a multiplier outputting a result obtained by multiplying a component of a d-axis current output from the high-pass filter by a compensation rate (Kd) as a current command value (id*);
   a multiplier outputting a result obtained by multiplying the component of the q-axis current output from the dq converter or a component of a q-axis current output from the high-pass filter by a compensation rate (Kq) as a current command value (iq*);
   a calculator calculating a voltage command value (Vid, Viq) that is a command value of a voltage (Vr) to be output from the active filter based on an output of each of the multipliers and a result of detecting the compensation current (Ic); and a driving signal generator circuit generating a signal (G) driving and controlling the active filter based on the voltage command value (Vid, Viq), wherein the compensation rate (Kq) of the q-axis current in the multipliers and the compensation rate (Kd) of the d-axis current in the multipliers are independently (C*) adjustable.

5. The control device of claim 2, wherein the compensation rate (Kq) of the q-axis current in the multipliers is adjusted according to a case temperature (tc) of a device constituting the active filter.

* * * * *